United States Patent [19]

Bui et al.

[11] Patent Number: 4,998,288
[45] Date of Patent: Mar. 5, 1991

[54] TWO DIMENSIONAL HYBRID DIGITAL CONVOLVER

[75] Inventors: Tuan H. Bui, Piscataway; Steven A. Steckler, Clark, both of N.J.

[73] Assignee: Harris Semiconductor Patents, Inc., Melbourne, Fla.

[21] Appl. No.: 456,397

[22] Filed: Dec. 26, 1989

[51] Int. Cl.$^5$ .............................................. G06K 9/40
[52] U.S. Cl. ................................. 382/54; 364/724.05; 364/724.12; 382/27; 382/49
[58] Field of Search ....................... 382/27, 41, 49, 54; 364/724.01, 724.12, 724.05, 724.17; 358/166, 167, 447, 463, 464

[56] References Cited

U.S. PATENT DOCUMENTS

| | | | |
|---|---|---|---|
| 4,231,095 | 10/1980 | Cassagne | 382/54 |
| 4,363,104 | 12/1982 | Nussmeier | 382/54 |
| 4,399,461 | 8/1983 | Powell | 382/54 |
| 4,433,438 | 2/1984 | Couturier | 382/54 |
| 4,443,855 | 4/1984 | Bishop et al. | 382/54 |

Primary Examiner—Leo H. Boudreau
Attorney, Agent, or Firm—Henry I. Schanzer

[57] ABSTRACT

A hybrid 2-D digital convolver in a video image processor to enhance or supress image characteristics comprises a rectangular array of delay elements of pixel duration arranged in rows and columns. A digital serial stream of data encoding pixel values of a 2-D image is coupled to successive rows of delay elements of the array in horizontal-line lengths. The pixel values are modified in a multiplier of preselected weight in series with the input of each columnar delay element in a row. An adder connected between pixel delay elements in each row combines weighted inputs and outputs from prior delay elements. The output of the last delay element of each row is combined with the row outputs of prior rows and the output of the adder following the output of the last delay element off the last row forms the processed output of the convolver. The arrangement of adders and delay elements in each row avoids cumulative adder delays and thereby improves image processing efficiency.

15 Claims, 4 Drawing Sheets

TWO DIMENSIONAL HYBRID DIGITAL CONVOLVER

FIELD OF THE INVENTION

This invention relates in general to processing of multidimensional data such as images and, in particular, to digital filters for modifying or enhancing two-dimensional data.

BACKGROUND OF THE INVENTION

Digital image processing involves the conversion of a continuous analog image field or other multi-dimensional data into an equivalent digital form. The physical image is spatially sampled to produce an array of numbers which can be processed into the reconstruction of a continuous image for viewing. An image can encompass both pictorial data and analytical data from, for example, physical, medical or seismic processes. For images in motion, digital samples can also be time varying. The rate of sampling is typically equal to or greater than twice the highest frequency component in the moving image, i.e., at the Nyquist rate. Over-sampling (i.e., sampling at higher than the Nyquist rate) is often the rule.

Two-dimensional (2-D) images are commonly encoded raster fashion by scanning row-by-row (horizontally) across columns (vertically) of image spots. Scanned points called pixels are positionally defined by discrete horizontal and vertical pairs of coordinate numbers. Each pixel is sampled to produce a digital number quantized to its intensity or density. An array of such numbers encodes the finite field of the overall 2-D image. Due to various distortions, such as quantization errors, non-uniform illumination of the image, thermal noise and impulse noise, the stored encoded image is less than perfect.

In order to reproduce the scanned image in a manner that is acceptable to an observer or to analytical systems, the stored numerical data often must be processed digitally. Such processing is called convolution and the apparatus for implementing convolution is called a convolver.

Two-dimensional (2-D) convolution is widely employed in image processing for noise filtering, feature enhancement, and image restoration. As a first step in convolution of encoded data, including raster-encoded data, adjacent pixels on a succession of scanned rows or horizontal lines are ordered into kernels of pixels in an m x n array, where m may be set equal to n in order to square the kernel. As scanning proceeds the kernels slide along the image first horizontally and then vertically. Each kernel can be masked by a predetermined matrix of coefficients to replace the kernel at a central location, for example, with a single composite value that tends to smooth the image and substantially eliminate single-pixel noise, which might otherwise show up in the reproduced image as undesired blips of non-correlated noise (e.g., white or "snow"). In this manner each pixel is compared with its surrounding neighbors and appropriately adjusted.

Processing each kernel in real time requires a number of multiplications equal to the number of pixels in a kernel and an accumulation of the resulting products. In performing a multiplication, the number of bits in a product is double the number of bits in the coefficient. The accumulated products can later be truncated or rounded to the number of bits in the original sample, as necessary.

In a known direct embodiment, a 2-D convolver operates on a serial stream of sampled data from a raster scanned image fed into sequential delay lines of horizontal-line length. An m x n or (m−1) x n array of pixel-wide delay elements receives, respectively, an undelayed data stream representing the leading m pixels of a current horizontal line, a data stream delayed by one horizontal-line length representing m adjacent pixels of an immediately prior horizontal line, a data stream delayed by two horizontal-line lengths representing m further adjacent pixels of the second prior horizontal line, and so forth up to n−1 horizontal-line delays. Each sample at the output of a pixel delay element is multiplied by a coefficient to form a product value. The product values of each kernel are summed in a plurality of adders to form the composite scaled output.

This prior art direct embodiment has the disadvantage that the adders in the same horizontal rows and vertical columns are serially connected. Each adder has an inherent constant delay d and the adder delays are cumulative. The result for a squared kernel of order N is a delay of 2(N−1) times the unit delay d. This 2(N−1)d delay magnitude is significant and limits the operating speed of the convolver. In large order convolvers, such a delay can become unmanageable.

It is desirable to have a hybrid convolver structure which avoids the foregoing cumulative delays and thereby improves image processing efficiency.

SUMMARY OF THE INVENTION

The present invention is directed to a 2-D digital convolver for video and image processing which comprises a rectangular array of delay elements of pixel duration arranged in rows and columns. A digital serial stream of data encoding pixel values of a 2-D image is coupled to successive rows of delay elements of the array in horizontal-line lengths. The pixel values are modified in a multiplier of preselected weight in series with the input of each columnar delay element in a row. An adder connected between pixel delay elements in each row combines weighted inputs and outputs from prior delay elements. The output of the last delay element of each row is combined with the row outputs of prior rows and the output of the adder following the output of the last delay element of the last row forms the processed output of the convolver.

According to one aspect of the invention, the digital serial stream of data encoding pixel values of a 2-D image is applied to successive rows of delay elements of the array in horizontal-line lengths respectively undelayed and delayed by multiples of such horizontal-line length up to one fewer multiples than the number of rows in such array.

According to another aspect of the invention compensating horizontal-line delays are placed in respective input and output lines as are necessary to synchronize or align neighboring pixels on successive horizontal lines.

This invention will be better understood from the following detailed description taken in connection with the accompanying drawing and claims.

DETAILED DESCRIPTION

A 2-D digital convolver is a digital filter which takes a serial stream of video input data and produces an output which is the convolution sum of the input data. The equation for an N-th order convolver is as follows:

$$Y(k,l) = \sum_{i=0}^{n-1} \sum_{j=0}^{m-1} h(i,j) \times (k-i, l-j),$$

where

Y = the convolved output;
m−1 = the maximum number of horizontal lines in a convolved kernel;
n−1 = the maximum number of pixels in a horizontal line in a convolved kernel;
i = horizontal index of an input pixel;
j = vertical index of an input pixel;
k = column coordinate of a output pixel;
l = row coordinate of an output pixel;
h = multiplier coefficient; and
x = input intensity value of a scanned pixel.

The input data can be thought of as a matrix with each element thereof corresponding to a pixel element and the output data can be interpreted as the weighted sum of m x n neighboring pixels.

Figure 1:
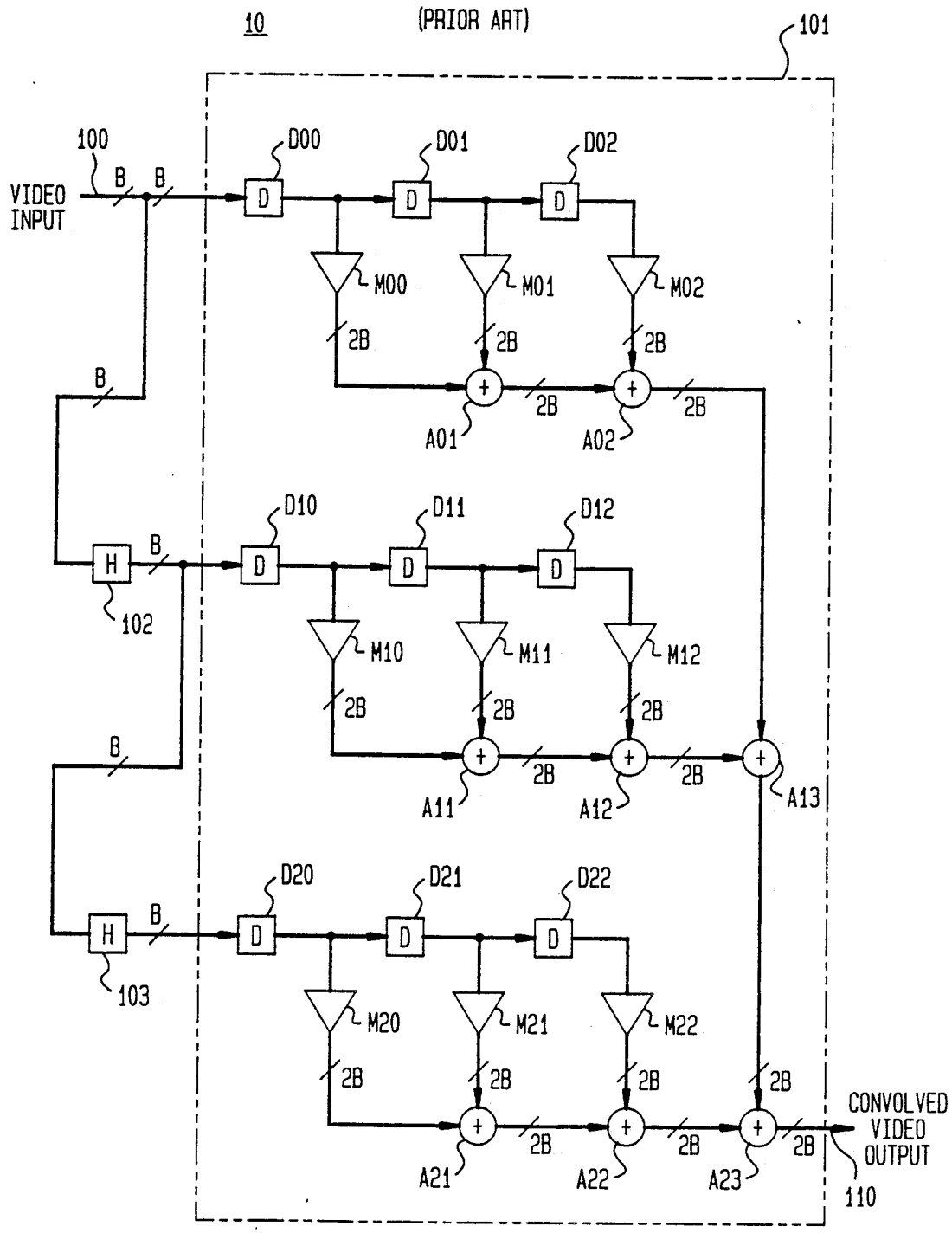
FIG. 1 shows a block schematic diagram of a known prior art direct embodiment of a 2-D digital image convolver.

Referring now to FIG. 1, there is shown a known direct implementation 10 of the foregoing equation for m=n=3 with a fixed delay in the output. Implementation 10 comprises first and second delays 102 and 103 each of a horizontal line duration and an array 101 (shown within a dashed line rectangle). A video input signal applied to line 100 arrives one pixel at a time in sequential horizontal fashion, e.g., one horizontal television raster line following another. Each pixel value is encoded as a multi-bit word of B bits, as indicated by the B slash on line 100.

The array 101 in FIG. 1 includes three-squared (9) pixel delay elements Dxx and multipliers Mxx and three-squared less one (8) adders Axx. Pixel-length delay elements Dxx i.e. nine delay elements D00, D01, ..., D22 are arranged in three rows and three columns, the rows being serially connected. The xx's symbolize rectangular row-column coordinates within the array with the top left location arbitrarily assigned as the origin 00. For example, the first delay element D (i.e. the first element of the first row) is designated as D00. The output of each row delay element Dxx feeds a multiplier element Mxx, having a preassigned coefficient value. The products formed in the outputs of multipliers Mxx are combined in adders Axx, first row-by-row, e.g., products from multipliers M00 and M01 are combined in adder A01, whose summation is in turn combined in adder A02 with the further product from the output of multiplier M02. Similarly, summations of the second and third rows are obtained in the outputs of adders A12 and A22. The summations from adders A12 and A22 are further combined with summations in the output of adder A02 in adders A13 and A23 and the summation from adder A23 finally appears as the convolved output on output line 110.

The video data in a serial stream is applied to the foregoing array 101 on input line 100 directly to top row one (the first row) and after horizontal line delays H in delay registers 102 and 103 to the respective middle and bottom rows af array 101. Each delay H has a delay time equal to that of a horizontal line of pixels. Illustratively, a horizontal line length may encompass 512 pixels. The instant data stream on lead 100 can be thought of as the current scanned line pixel data. The output of register 102 can be considered to be the scanned line data from the next preceding scanned line. The output of register 103 can further be envisioned as the pixel data of the second preceding scanned line. The result is that three of the pixel values from three consecutive scanned horizontal lines are synchronized at the outputs of delay elements Dxx. The nine neighboring pixel values in array 101 represent a kernel of the entire scanned image of a size such as 512 pixels horizontally by 512 pixels vertically.

Each pixel is illustratively encoded digitally in a multi-bit word B and the multiplier coefficients are also encoded digitally in a multi-bit word B. The products of the pixel values and the multiplier coefficients applied to adders Axx, however, are of two-word lengths. The two-word form is indicated by the dashed line labeled 2B. The convolved output on line 110 thus has a word length of 2B bits, but this output can be truncated or rounded to word-length B or other length by conventional means.

As the serial input stream continues, the kernel represented by the instantaneous array of pixels slides across the horizontal lines, then drops down line by line and slides across the image repeatedly until every pixel has appeared as the central point in a kernel and has been adjusted according to preassigned or programmable coefficient values.

It is to be noted here that the first column of delay elements (D00, D10 and D20) are redundant and their inclusion delays operation by one pixel width. They are shown here only to maintain parallelism with later FIGS. of the drawing, i.e., the transposed embodiments, where their presence is necessary.

The known direct implementation 10 shown in FIG. 1 has the disadvantage that adders are in series row-wise and then columnwise. Their inevitable fixed operational delays are cumulative and amount (in a square array such as the illustrative three-by-three array) effectively to four times the delay t per adder or 2(N−1)t in an N-th order array. The cumulative delay limits the mean operating frequency of the device. At higher array orders, the delay becomes unwieldy and difficult to manage.

Figure 2:
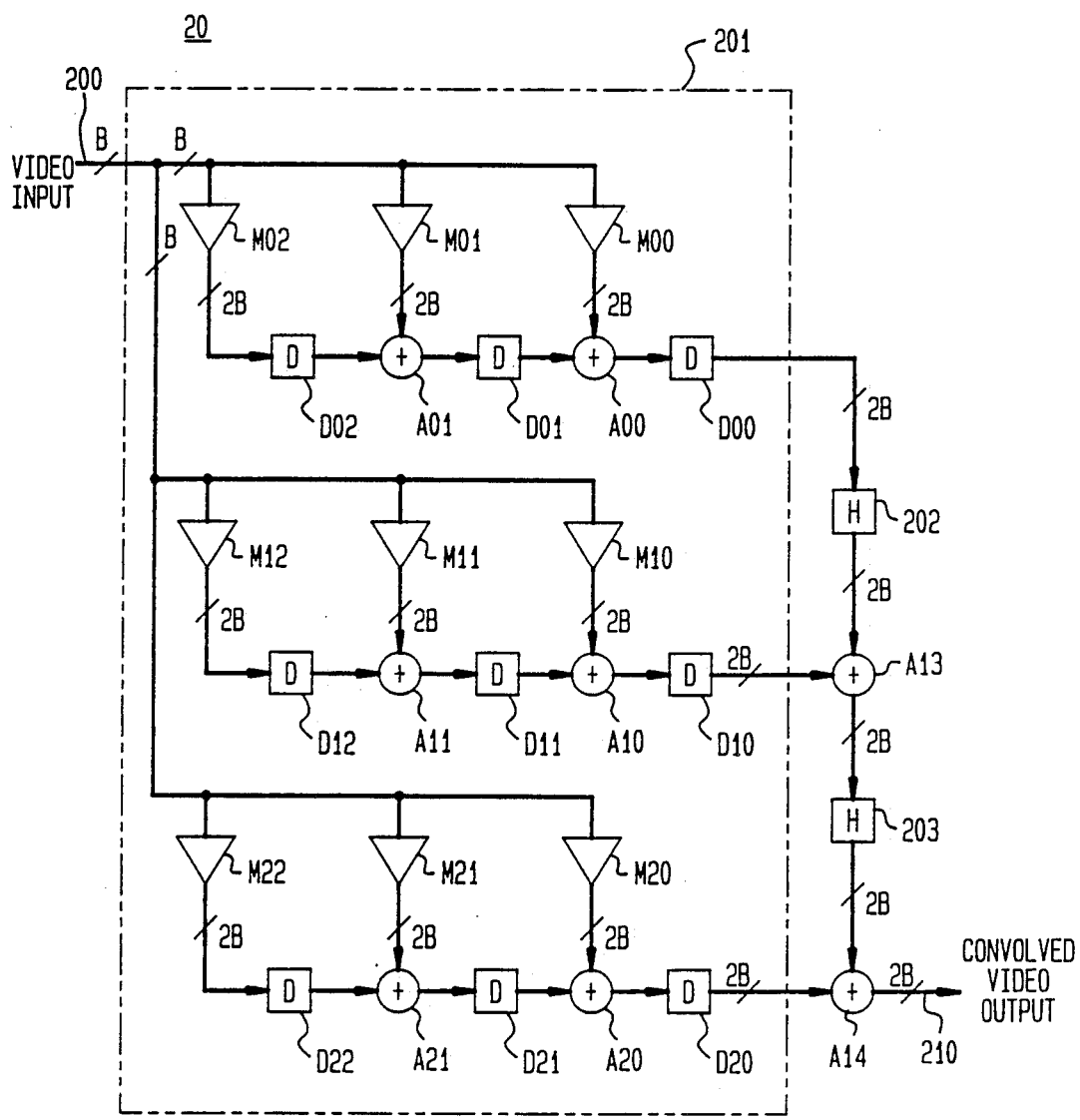
FIG. 2 shows a block schematic diagram of an embodiment of a 2-D digital image convolver in accordance with this invention.

Referring now to FIG. 2, there is shown an embodiment 20 which is a transposed implementation of the foregoing equation for m=n=3 in accordance with the invention. A array in embodiment 20 is formed by an exchange of columns of an original direct implementation 10 shown in FIG. 1 (i.e., multiplier M00) is in the third column of FIG. 2 rather than the first column as in FIG. 1. The video input signal on line 200 arrives one pixel at a time in sequential horizontal fashion, e.g., one horizontal television raster line. Each pixel value is encoded as an equal-length word of B bits, as indicated by the B slash on line 200.

The transposed embodiment 20 of FIG. 2 provides substantially the same function as implementation 10 of FIG. 1 but differs structurally. An array 201 (enclosed in broken lines) is arranged in three rows. Each row comprises three multipliers Mxx and three pixel length delays Dxx. All multipliers Mxx in a given row have their inputs in parallel and receive the same input pixel value at any given time. Delay elements Dxx receive the double-length word (2B) size product outputs of multipliers Mxx either directly (for the leftmost column) or through adders Axx inserted between the remaining delay elements in each row. For example, the top row delay element D02 has its input connected directly to the output of multiplier M02 and adders A01 and A00 are inserted between delay elements D02/D01 and D01/D00 while the outputs of multipliers M01 and M00 are applied to delay elements D01 and D00 through adders A01 and A00. The remaining rows are similarly arranged.

The output summations of each row are delayed by one and two horizontal-line length delays in registers 202 and 203, respectively, and further combined in adders A13 and A14 as shown in FIG. 2. The summation of the topmost row is delayed by one horizontal-line amount in register 202, its output is added to the output of the middle row in adder A13. The output of adder A13 is delayed by another horizontal-line amount in register 203, and its output is combined with the output of the bottom row of the array to form the convolved video output on line 210. In accordance with the invention, the inherent delays of the individual adders are no longer cumulative since the adders are located between pixel-delay elements and are thereby selectively isolated. It is to be noted, however, that the horizontal registers 202 and 203 in embodiment 20 of FIG. 2 are arranged to process double length (2B bit) words.

Figure 3:
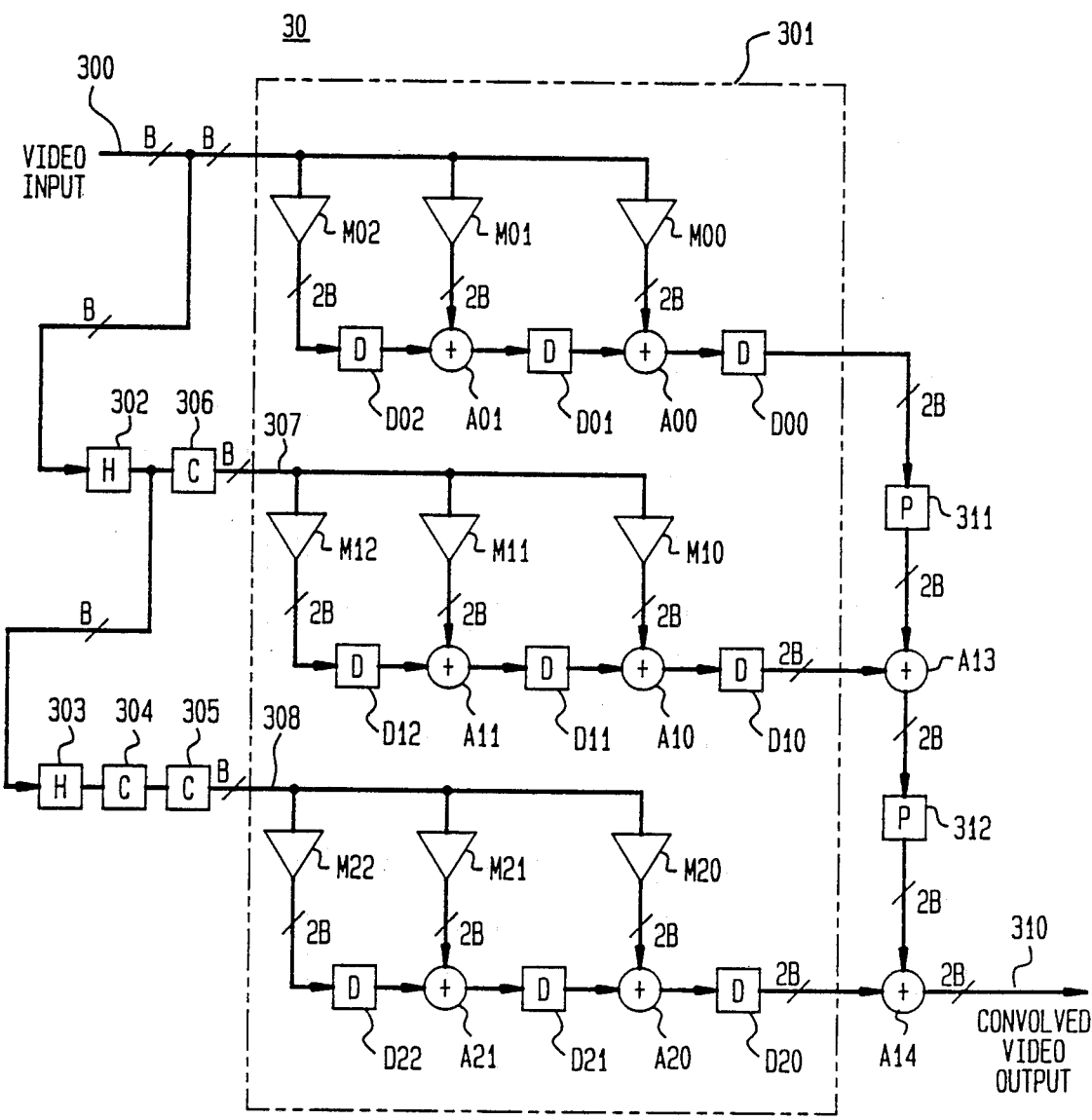
FIG. 3 shows a block schematic diagram of another hybrid embodiment of a 2-D digital image convolver in accordance with this invention.

Referring now to FIG. 3, there is shown a 2-D convolver 30 in accordance with the invention which combines the known direct and transposed embodiments of FIGS. 1 and 2 respectively, in a manner that avoids the disadvantages of these embodiments. Convolver 30 comprises horizontal line length delay elements (H) 302 and 303, compensating delay elements (C) 304, 305 and 306, pipeline delay elements (P) 311 and 312, adders A13 and A14, and an array (shown within a dashed line rectangle) 301. Array 301 comprises three rows, a top, a middle and a bottom row with each row being arranged in three aligned columns. Each row comprises three multipliers Mxx (where x=0 to 2), three pixel width delay elements Dxx (where x=0 to 2), two adders (e.g., A01 and A00 of the top row).

A video input signal is applied B width pixel by B width pixel to a line 300 and therefrom directly to the inputs of top most row multipliers M02, M01 and M00. Line 300 is also connected to the inputs of middle row multipliers M12, M11 and M10 through horizontal line length delay 302 and a compensating delay 306. Multipliers M22, M21 and M20 in the bottom row of array 301 receive video data through the serial delay path of horizontal line length delay 302, horizontal line length delay 303 and compensating delays 304 and 305. In this way, the top most row multipliers receive pixels of the present horizontal line. The middle row multipliers receive pixels of the next preceding horizontal line and the bottom row receives pixels of the second preceding horizontal line.

Each top row multipliers M02, M01 and M00 modifies the values of the pixels applied thereto in accordance with its preselected or programmed coefficient. The double width (2B) output of multiplier M02 is delayed in pixel width delay D02 and summed with the output of multiplier M01 in adder A01. Pixel width delay D01 delays the sum output from adder A01 whereby the delayed sum is added to the output of multiplier M00 in adder A00. Pixel width delay D00 further delays the signal from adder A00 to provide the top most row output.

Processing of the pixels in the middle row of array 301 is substantially similar except that the pixels applied to multipliers M12, M11 and M10 correspond to the preceding horizontal row through the operation of one horizontal line length delay 302 and compensating delay 306. The output of multiplier M12 delayed one pixel width in delay D12 is added to the output of multiplier M11 in adder A11. Adder A11's output delayed by pixel delay D11 is added to the output of multiplier M10 in adder A10 and further delayed in pixel width delay D10.

Multipliers M22, M21 and M20 receive pixels corresponding to the second preceding row through horizontal line length delays 302 and 303 and compensating delays 304 and 305. The processing of the bottom row includes adjusting the pixel values at the inputs of multipliers M22, M21 and M20 in accordance with individual coefficient values h, and delaying and summing the multiplier outputs in pixel width delays D22, D21 and D20 and adders A21 and A20.

Array 301 is substantially identical to array 201 in FIG. 2 and shows multipliers Mxx to occur in the signal paths before the pixel delay elements Dxx. The video input signal stream representing the present horizontal line is applied directly to multipliers M02, M01 and M00 of the topmost (first) row. A single horizontal line delayed version representing the next preceding horizontal line is applied through a one horizontal line delay (H) register 302, delay element 306 and line 307 to multipliers M12, M11 and M10 of the next succeeding row and a double horizontal line delayed version representing the second preceding horizontal line is applied to multipliers M22, M21 and M20 of the bottom-most row through horizontal line length delays 302 and 303, delay elements 304 and 305 and line 308. Delay registers 302 and 303 carry signals of one word-length (B) only.

It is to be noted that in accordance with the invention adders Axx in FIG. 3 are decoupled from each other row-by-row by being interspersed between pixel delay elements Dxx. The row outputs from delays D00, D10 and D20 are additively combined externally in adders A13 and A14 as in the transposed embodiment of FIG. 2. Pixel extent pipeline delay units (P) 311 and 312 are placed in the row output circuits of FIG. 3 to isolate adders A13 and A14 from each other, a function which horizontal line length delay elements 202 and 203 performed in the embodiment of FIG. 2.

The correction afforded by the pipeline delay unit P in FIG. 3, however, misaligns the neighboring pixel values at delay elements Dxx of the middle and bottom-most rows. In order to compensate for this misalignment compensating (C) pixel-length delay element 306 is placed between delay register 302 and line 307. Similarly, compensating pixel length delays 304 and 305 are placed between horizontal delay register 303 and line 308. Advantageously, the embodiment of FIG. 3 avoids double word (2B) horizontal line length delays of the transpose implementation 20 while reducing the adder circuit delays inherent in direct implementation 10.

Figure 4:
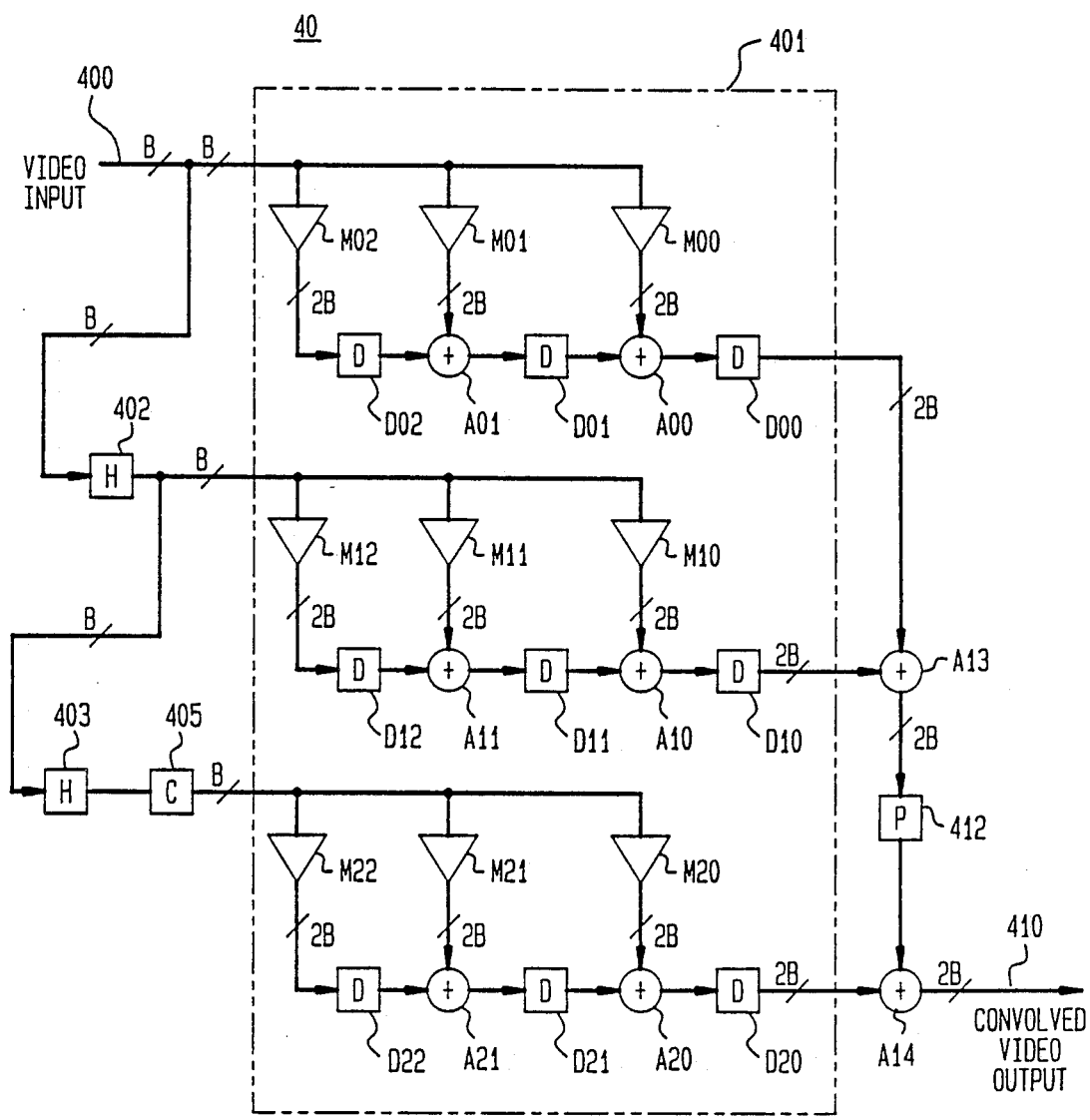
FIG. 4 shows still another block schematic diagram of a hybrid embodiment of a 2-D digital image convolver in accordance with this invention.

Referring now to FIG. 4, there is shown another 2-D hybrid convolver 40 which is a variation of the hybrid convolver 30 shown in FIG. 3 and is in accordance with the invention. Convolver 40 has a reduced number of compensating and pipeline delay elements as compared to convolver 30 of FIG. 3. Convolver 40 comprises an array (shown within the dashed line rectangle) 401 which is essentially the same as array 301 of convolver 30 of FIG. 3. The difference between convolver 30 of FIG. 3 and convolver 40 of FIG. 4 lies in the omission of two of the compensating delay elements (C) in the input lines to the rows of the convolver array and the omission of a pipeline delay element (P) in an output line of the array.

The purpose of the pipeline delay elements P in FIG. 3 is to provide isolation between successive adders and the purpose of the compensating delay elements C is to align the pixels in successive rows of the image being convolved. The pipeline delay element 311 in FIG. 3 can be eliminated without causing two successive adders to be placed directly in series. This action also removes one pixel width of delay for signals progressing down the top row of the array. Thus, a compensating delay element corresponding to compensating delay 306 in FIG. 3 is no longer needed. But this action leaves an unnecessary pixel delay between the middle and bottom rows of the array and allows the removal of a compensating delay element corresponding to compensating delay 304 of FIG. 3 from the input to the bottom row of the delay. The results of the removal of pipeline delay element 311 and the compensating delay elements 304 and 306 are shown in FIG. 4. Consequently, the structure of FIG. 4 provides the same functions as that of FIG. 3 but with a reduction in the number of pipeline and compensating delay elements.

There have been described novel 2-D convolver structures for image and video processing, both of which are amenable to Very Large Scale Integration (VSLI) implementation. These structures are modular and can be cascaded to realize large-order digital convolvers without the delay penalty of the direct embodiment or the large hardware cost of the transposed embodiment. The technique disclosed can be straightforwardly extended to three dimensions, which would include neighboring pixels from succeeding and following image fields.

It is to be understood that the specific embodiments referred to in this specification are exemplary embodiments that are intended to be merely illustrative of the spirit and scope of the appended claims. Modifications can readily be made by those skilled in the electronic arts consistent with the principles of this invention. For example, the number of rows can exceed three and the of columns can exceed three. Still further, the number of rows and columns do not have to be identical. Furthermore, there can be an even number of rows and an odd number of columns or an odd number of rows and an even number of columns or an even number of rows and columns.

What is claimed is:

1. In an image processing system operating on a serial stream of digitized picture element (pixel) intensity values, a convolver comprising:

a rectangular array of pixel-width delay elements arranged in horizontal rows and vertical columns to define a convolution kernel;

a plurality of adders, each being individually positioned between adjacent delay elements in each row of said array;

a plurality of multipliers equal in number to the delay elements and individually associated therewith in each row of the array, each multiplier having an assignable coefficient value;

an input terminal for said array for accepting a serial stream of image data;

means for connecting the array input terminal to the multipliers of each row;

a plurality of end-row adders respectively connected to outputs of succeeding rows, other than the first row thereof, of said array and the output of the end-row adder at the highest order row of said array serving as the convolver output of said processing system; and one or more pipeline delay elements of pixel-delay extent in series between end-row adders.

2. In an image processing system operating on a serial stream of digitized picture element (pixel) intensity values, the convolver of claim 1 wherein the means for connecting the array input terminal to the multipliers of each row comprises a direct connection between the array input terminal and the multipliers of each row.

3. In an image processing system operating on a serial stream of digitized picture element (pixel) intensity values, the convolver of claim 1 wherein:

the means for connecting the array input terminal to the multipliers of each row comprises:

a plurality of serially connected delay registers, equal in number to one fewer than the number of rows in said array, the delay of each of said registers being equal to that of a horizontal line of a scanned image;

a direct connection for said array input terminal to the multipliers in the first row of said array and to the first of said delay registers;

a connection from the outputs of succeeding delay registers to inputs of multipliers in succeeding rows of said array; and one or more compensating delay elements of pixel-delay extent connected in series between a delay register and the multipliers in one or more rows of said array to control synchronization of pixels in succeeding rows.

4. In an image processing system operating on a serial stream of digitized picture element (pixel) intensity values, a convolver comprising:

a rectangular array of pixel-width delay elements arranged in horizontal rows and vertical columns to define a convolution kernel;

a plurality of adders, each being individually positioned between adjacent delay elements in each row of said array;

a plurality of multipliers equal in number to the delay elements and individually associated therewith in each row of the array, each multiplier having an assignable coefficient value;

an input terminal for said array for accepting a serial stream of image data;

a plurality of serially connected delay registers, equal in number to one fewer than the number of rows in said array, the delay of each of said registers being equal to that of a horizontal line of a scanned image;

a direct connection for said array input terminal to the multipliers in the first row of said array and to the first of said delay registers;

a connection from the outputs of succeeding delay registers to inputs of multipliers in succeeding rows of said array;

one or more compensating delay elements of pixel-delay extent connected in series between a delay register and the multipliers in one or more rows of said array to control synchronization of pixels in succeeding rows;

a plurality of end-row adders equal in number to one fewer than the number of rows of the array with each end-row adder having first and second inputs and an output;

an output of each row of the array, other than the output of the first row, being coupled to the first input of a separate one of the end-row adders;

the output of the first row of the array being coupled to the second input of the end-row adder having the first input thereof coupled to the output of the second row;

the output of each of the end-row adders being coupled to the second input of the succeeding end-row adder except for the output of the end-row adder having the first input thereof coupled to the output of the last row;

the output of the end-row adder having the first input thereof coupled to the output of the last row being coupled to an output of the convolver; and one or more pipeline delay elements of pixel-delay extent in series between end-row adders.

5. In an image processing system operating on a serial stream of digitized picture element (pixel) intensity values, a convolver comprising:

a rectangular array of pixel-width delay elements arranged in horizontal rows and vertical columns to define a convolution kernel, each delay element having input and output terminals;

a plurality of adders, each having first and second input terminals and an output terminal, positioned between the output and input terminals of adjacent delay elements in each row by way of the first input terminal and the output terminal thereof;

a plurality of multipliers, each having an assignable coefficient value and input and output terminals, the input terminals in each row of said array being connected together and the output terminals being connected respectively to an input terminal of a first delay element in each row of said array and to a second input terminal of individual adders in each row of said array;

an input terminal for said array for accepting a serial stream of image data;

a plurality of serially connected delay registers, each having input and output terminals, equal in number to one fewer than the number of rows in said array, the delay of each of said registers being equal to that of a horizontal line of a scanned image;

a direct connection for said array input terminal to the input terminals of the multipliers in the first row of said array and the input terminal of the first of said delay registers;

a connection from the output terminals of succeeding delay registers to the input terminals of multipliers in succeeding rows of said array;

one or more compensating delay elements of pixel-delay extent in series between an output terminal of a delay register and the input terminals of multipliers in one or more rows of said array to control synchronization of the pixels in succeeding rows;

a plurality of end-row adders equal in number to one fewer than the number of rows of the array with each end-row adder having first and second inputs and an output;

an output of each row of the array, other than the output of the first row, being coupled to the first input of a separate one of the end-row adders;

the output of the first row of the array being coupled to the second input of the end-row adder having the first input thereof coupled to the output of the second row;

the output of each of the end-row adders being coupled to the second input of the succeeding end-row adder except for the output of the end-row adder having the first input thereof coupled to the output of the last row;

the output of the end-row adder having the first input thereof coupled to the output of the last row being coupled to an output of the convolver; and one or more pipeline delay elements of pixel-delay extent having input and output terminals in series, respectively, with the output and second input terminals of succeeding end-row adders and between the final output terminal of the first row of said array and the second input terminal of the end-adder of the second row of said array.

6. In an image processing system operating on a serial stream of digitized picture element (pixel) intensity values, the convolver of claim 4 in which one or more compensating delay elements are placed in series with succeeding rows after the first row of said array to achieve alignment of pixels on succeeding horizontal image lines.

7. In an image processing system operating on a serial stream of digitized picture element (pixel) intensity values, the convolver of claim 5 in which one or more compensating delay elements are placed in series with succeeding rows after the first row of said array to achieve alignment of pixels on succeeding horizontal image lines.

8. In an image processing system operating on a serial stream of digitized picture element (pixel) intensity values, the convolver of claim 4 in which the number of rows and columns in said array is equal.

9. In an image processing system operating on a serial stream of digitized picture element (pixel) intensity values, the convolver of claim 4 in which the number of rows and columns in said array is equal and odd.

10. In an image processing system operating on a serial stream of digitized picture element (pixel) intensity values, the convolver of claim 4 in which the number of rows and columns is unequal and odd.

11. In an image processing system operating on a serial stream of digitized picture element (pixel) intensity values, the convolver of claim 5 in which the number of rows and columns in said array is equal.

12. In an image processing system operating on a serial stream of digitized picture element (pixel) intensity values, the convolver of claim 5 in which the number of rows and columns in said array is equal and odd.

13. In an image processing system operating on a serial stream of digitized picture element (pixel) intensity values, the convolver of claim 5 in which the number of rows and columns is unequal and odd.

14. A convolver for processing a a serial stream of digitized element (pixel) signals of a scanned image arranged in horizontal lines comprising:
- an input terminal for receiving the serial stream of pixel signals;
- a set of m devices for processing the pixel signals from the input terminal arranged in rows;
- each row processing device comprising:
- means for serially receiving pixel signals, n multipliers each connected to the pixel receiving means for modifying the pixel signals from the receiving means with an assignable coefficient, and means for forming an output signal representative of the sum of m successive modified pixels including n serially arranged pixel extent delay elements each associated with one of the multipliers and n−1 adder elements each individually positioned between adjacent ones of the m serially arranged delay elements;
- a set of m−1 serially connected delay registers, the delay of each of said registers being equal to that of a horizontal line of the scanned image;
- the input terminal being directly connected to the receiving means of the first row processing device and to the input of the first of the delay registers;
- the outputs of succeeding delay registers being coupled to the receiving means of succeeding row processing devices through one or more compensating delay elements of pixel-delay extent to control synchronization of pixels in succeeding rows;
- a plurality of end-row adders respectively connected to the output signal forming means of succeeding row processing devices other than the first row processing device; and
- one or more pipeline delay elements of pixel-delay extent connected between succeeding end-row adders.

15. The convolver for processing a serial stream of digitized element (pixel) signals of a scanned image arranged in horizontal lines of claim 14 wherein the pixel signals are of single (B bit) word width, each delay register of horizontal line delay extent is of single (B bit) word width and each pipeline delay element of pixel delay extent is of double (2B bit) word width.

* * * * *